United States Patent [19]

Weller

[11] 4,156,854
[45] May 29, 1979

[54] DIFFERENTIAL AMPLIFIER BALANCING SYSTEM

[75] Inventor: David R. Weller, Bernardsville, N.J.

[73] Assignee: Bell Telephone Laboratories, Incorporated, Murray Hill, N.J.

[21] Appl. No.: 909,950

[22] Filed: May 26, 1978

[51] Int. Cl.² .............................................. H03F 3/45
[52] U.S. Cl. .................................. 330/259; 307/264; 330/134
[58] Field of Search ................. 330/134, 254, 259, 69; 307/264; 328/31

[56] References Cited

U.S. PATENT DOCUMENTS

| 3,398,373 | 8/1968 | Caswell | 307/237 X |
| 3,721,835 | 3/1973 | Hess | 307/264 X |
| 3,723,895 | 3/1973 | Peil | 330/254 |

Primary Examiner—James B. Mullins
Attorney, Agent, or Firm—Charles Scott Phelan

[57] ABSTRACT

Complementary outputs of a differential amplifier are individually peak detected and the resulting signals are applied to the amplifier differential input in a manner to cause the output peak excursions to have substantially the same direct current levels. This causes the crossover of the two outputs to occur at the midpoint of the signal swing regardless of the input signal peak-to-peak swing, at whatever level.

11 Claims, 4 Drawing Figures

DIFFERENTIAL AMPLIFIER BALANCING SYSTEM

TECHNICAL FIELD

This invention relates to arrangements for balancing differential amplifier output signals.

BACKGROUND OF THE INVENTION

Differential amplifiers exhibit internal effects, e.g., due to temperature variations or component value mismatches within manufacturing tolerances, that cause amplifier complementary output signals to be unbalanced in the sense of having significantly different direct current peak levels for corresponding excursions in the same direction. Similar effects may be produced, e.g., by temperature drifts in components in the amplifier input circuitry. These different levels are troublesome at least in differential signal operations because they cause the complementary signals to experience, during information state transistions, equal-amplitude crossings at different phases with respect to the time base of the binary digital signals depending upon temperature variations, signal strength, and internal gains of the amplifier. In the frequent cases where input information signal swings are in an amplitude range which is comparable to the magnitude of the imbalance between the complementary output signals those outputs may not cross at all during the transitions.

In a C. F. Wheatley U.S. Pat. No. 3,983,502 quiescent current flow in a differentially driven amplifier load is reduced by degeneratively feeding back to the input of the amplifier a low pass filtered version of the differential load signal. However, this approach would appear to compress amplifier low frequency gain as a function of that feedback rather than directly correcting the amplifier output imbalance as to noncoincident peaks of complementary signals.

A W. W. Brown et al. U.S. Pat. No. 4,027,152 merges differential amplifier outputs in a common peak detector, the output of which is used as an automatic gain control signal without affecting any possibile imbalance between the amplifier output signals.

SUMMARY OF THE INVENTION

The imbalance between complementary outputs of a differential amplifier is corrected in accordance with an illustrative embodiment of the present invention by separately applying peak signal information from those outputs to differential inputs of the amplifier in an appropriate sense to reduce the imbalance. In one illustrative application, the complementary outputs are also applied to different inputs, respectively, of a differential comparator to indicate information signal transition at approximately equal-signal level crossings of the complementary signals during each information state transition.

BRIEF DESCRIPTION OF THE DRAWING

A more complete understanding of the invention may be obtained from a consideration of the following detailed description in connection with the appended claims and the attached drawing in which:

DETAILED DESCRIPTION

Figure 1:
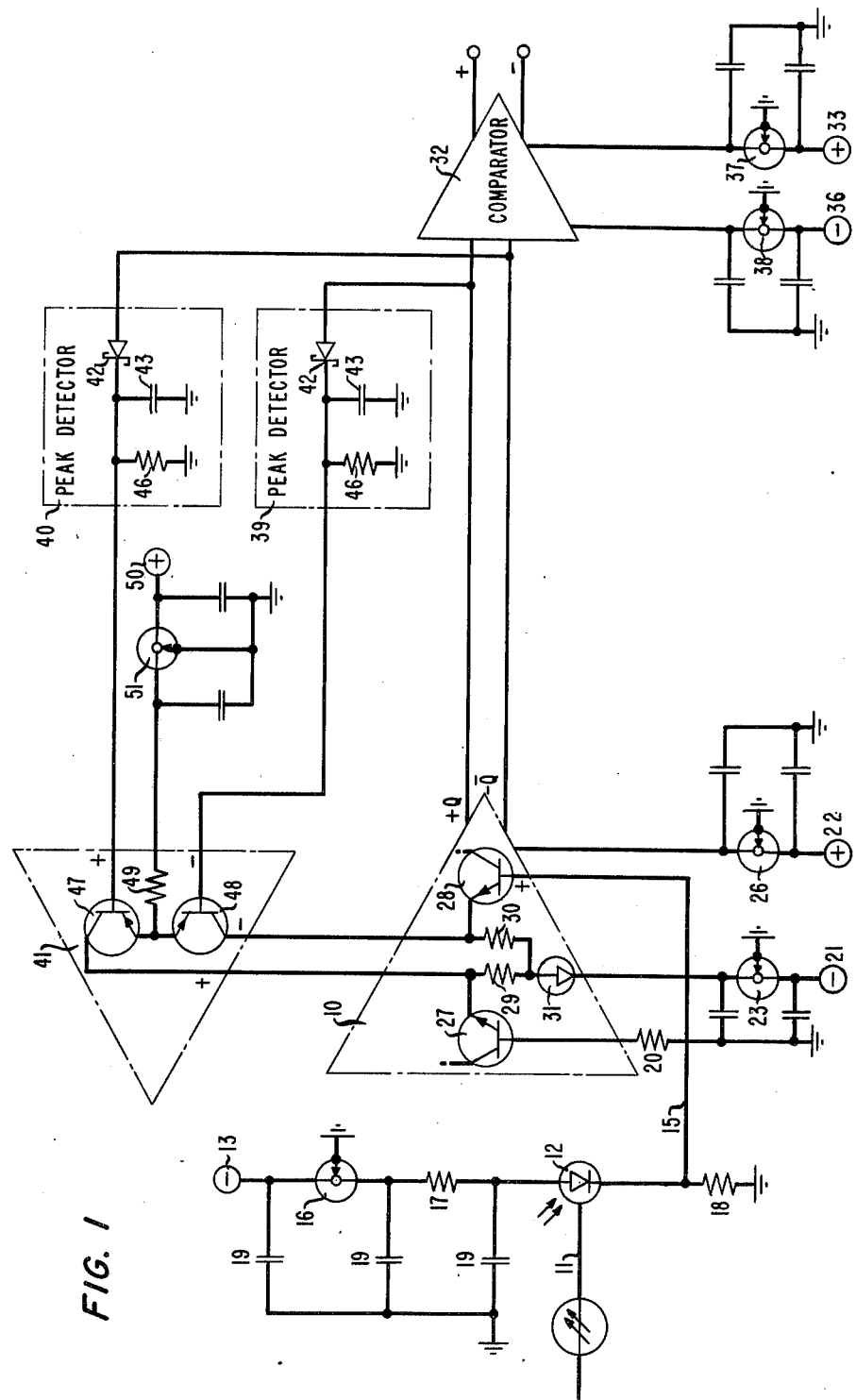
FIG. 1 is a diagram, partially in schematic form and partially in block and line diagram form, of a differential amplifier arranged in accordance with the present invention.

The invention is illustrated in the drawing as applied to a balanced amplifier 10 which is utilized as a receiver in a fiber optical communication system. To this end an optical fiber 11 provides an information signal transmission path which is coupled to a photodiode 12 for converting light pulse signals to corresponding electric voltage signals. Binary coded signals so received in an optical communication system may have widely different peak-to-peak values from time to time depending upon the characteristics of the optical transmission path coupled to fiber 11. Furthermore, within the range of those values the coding format usually includes one or the other of only two information signal states, either high or low. Otherwise different coding techniques may be represented by the incoming signals. Such techniques may include for example, non-return-to-zero, Manchester, or Miller (sometimes called delayed modulation or modified frequency modulation) coding.

Photodiode 12 is connected in a potential dividing circuit including a negative voltage supply 13. That supply and others in the drawing, are schematically represented by a circled polarity sign corresponding to the polarity of the supply terminal connected to the electric circuit point of the schematic representation. A terminal of the opposite polarity is to be understood as being connected to ground. A voltage regulator 16 is connected in series with a resistor 17, the photodiode 12, and a further resistor 18 to ground. Capacitors 19 connect opposite terminals of the regulator 16 and resistor 17 to ground. Regulator 16 is, for example, of the type of the 78L and 79L regulators sold commercially by Motorola Incorporated for different supply polarities. A third regulator terminal is connected to ground. Binary signal state levels are developed across resistor 18 as light pulse signals in the fiber 11 turn the diode 12 off and on or otherwise control it between readily distinguishable levels of operation.

Amplifier 10 has complementary, or differential, inputs and outputs. Signals developed across resistor 18 are applied through a lead 15 to a noninverting one of those inputs, and the corresponding inverting input is connected to ground through a resistor 20 having a resistance of substantially the same value as the resistance of resistor 18. Those like resistors are employed to enhance common mode rejection of noise in the vicinity of the amplifier input. One percent film resistors are advantageously employed. Amplifier 10 is illustratively a differential amplifier such as the μA733 amplifier of the Signetics Corporation. All internal stages of such an amplifier are direct coupled. Negative and positive supplies 21 and 22 are coupled to amplifier 10 through voltage regulators 23 and 26, respectively. Only a partial schematic diagram is shown for the internal connections of the amplifier 10 since that is all that is necessary to illustrate the connections for the present invention.

Thus, the amplifier 10 includes an input differential amplifier stage comprising npn transistors 27 and 28 having their base terminals connected, respectively, to the aforementioned inverting and noninverting input connections of the amplifier. Emitter terminals of these transistors are connected through resistors 29 and 30, respectively, to a current source-connected transistor 31, schematically represented by a circled arrow. The other terminal of that transistor is connected to the voltage regulator 23. Collector connections of the two transistors 27 and 28 are coupled (by circuits not specifically shown) through other stages of the amplifier to inverted and noninverted output connections, respectively, of the amplifier and which are otherwise designated $\overline{Q}$ and Q.

A differential comparator 32, such as the μA760 comparator of the Fairchild Corporation, has its differential input connections direct coupled to receive signals from the Q and $\overline{Q}$ signals of amplifier 10. With this arrangement, the comparator indicates a match when the complementary input signals cross one another, i.e., when they exhibit equal signal levels during data information state transitions between binary ONE and binary ZERO states. The complementary outputs of comparator 32 experience binary signal state changes in response to each detected match in the comparator. Positive and negative supplies 33 and 36 are coupled to the comparator through voltage regulators 37 and 38, respectively.

Comparator 32 is advantageously one that operates over a wide range. That is, its range is large enough so that it is responsive to expected level variation in the output of amplifier 10 without the need for automatc gain control to confine those variations.

The employment of separate regulators in power supply connections for separate components of the circuit of FIG. 1 decoupled noises, such as supply bus noises, by about 60 decibels in one embodiment. This quieting of amplifier operation improves the operating error rate of the overall circuit.

Figure 2:
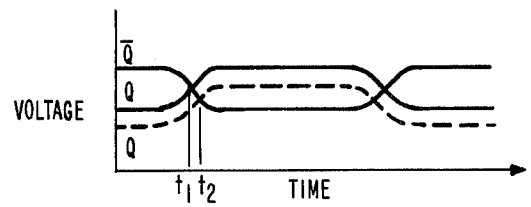
FIGS. 2 through 4 are signal wave diagrams illustrating operation of the amplifier.

As described up to this point, temperature effects and circuit element mismatches within manufacturing tolerances will frequently cause a significant shift between the Q and $\overline{Q}$ outputs of amplifier 10 so that they exhibit different peak values for opposite binary signal states during signal reception. As shown by solid lines in FIG. 2, the Q and $\overline{Q}$ outputs of amplifier 10 cross at a time $t_1$, and at a certain amplitude, during transitions between ONE and ZERO states. In the central time portion of the diagram the Q signal is high and $\overline{Q}$ is low, and that is, assumed to represent a binary ONE. The adjacent diagram portions where $\overline{Q}$ is high represent binary ZEROs. Thus, the ideal situation is to have, for example, the Q peaks in One at the same level as the $\overline{Q}$ peaks in ZEROs. However, a relatively small shift between the average values of the Q and $\overline{Q}$ signals, shown in FIG. 2 by a dashed waveform as a drop in the Q level, produces a crossing of those Q and $\overline{Q}$ signals at a later phase corresponding to the time $t_2$. The indicated internal effects on the amplifier will typically affect the two complementary outputs in opposite directions, but for convenience of illustration the effect has been shown in FIG. 2 as applied only to the Q signal.

Figure 3:
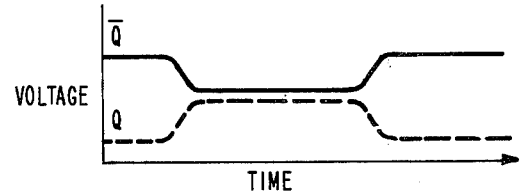

FIG. 3 illustrates for the shifted Q and the $\overline{Q}$ outputs of amplifier 10 the situation in which the aforementioned internal amplifier factors cause a sufficient shift in Q and $\overline{Q}$ output values so that they no longer cross a comon amplitude level during data transitions.

In order to assure that the complementary outputs of amplifier 10 exhibit substantially the same direct current levels for peaks of opposite binary signal states, those Q and $\overline{Q}$ outputs are direct coupled through peak detectors 39 and 40, respectively, to inverting and noninverting inputs, respectively, of a further differential amplifier 41. Each peak detector is the same and advantageously includes in the series signal path thereof a diode 42, such as a Schottky diode poled for forward conduction toward amplifier 41. In addition in different shunts, thereof, there are capacitor 43 and a resistor 46 each connected to ground. Impedance values of the capacitor and resistor in each peak detector are selected to give a time constant which is substantially larger than the period of the signal of lowest data bit rate which is expected to be amplified in amplifier 10. In one embodiment, the time constant of each peak detector was approximately 10 times the period of the lowest expected data bit rate.

The differential amplifier 41 includes two pnp transistors 47 and 48. Bases of the two transistors are connected to receive signals from the noninverting and inverting inputs, respectively, of the amplifier. Collectors of the same transistors are direct coupled to a low impedance point in an input stage of amplifier 10 to reduce sensitivity to noise of the feedback circuit. Such a point is at the emitter terminals of the transistors 27 and 28, respectively, in the amplifier 10. Thus, Q and $\overline{Q}$ outputs of amplifier 10 are differentially direct coupled through their respective peak detectors and amplifier 41 to inputs of amplifier 10 to reduce imbalances between those Q and $\overline{Q}$ outputs.

Emitter terminals of transistors 47 and 48 are connected together and through a common resistor 49 to receive operating potential from a positive supply 50 by way of a voltage regulator 51. The resistance of the resistor 49 is selected to be large enough so that it does not appreciably reduce the peak detector time constants and large enough so that it prevents signals from amplifier 41 from causing deteriorating of the normal peak-to-peak output of amplifier 10.

Figure 4:
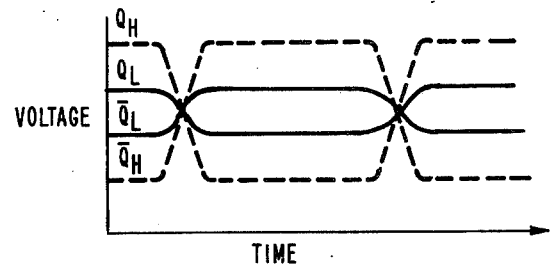

The result of the use of peak signal information is compensating feedback, as herein before described, is to adjust dynamically the balance in amplifier 10 without substantially affecting the amplifier gain in order to offset any imbalance between peak values of the Q and $\overline{Q}$ output signals of that amplifier. Accordingly, as in FIG. 4, the peak excursions for the complementry signals are substantially the same for opposite data information states, whether the signal swings between high and low signal levels of the respective states are large ($Q_H$, $\overline{Q}_H$) or small ($Q_L$, $\overline{Q}_L$). Likewise, the Q and $\overline{Q}$ signals in either case cross each other during each data information transition at substantially the same amplitude level, which level is midway in the peak-to-peak swing.

In the illustrative embodiment, the various impedance values are not as critical as in many prior art amplifiers. For example, a data-unbalanced input signal in a 30 decibel power variation range can be tolerated. The reason is that the combination of the differential amplifier 10 with the peak compensating feedback and the differentially driven comparator 32 allows the circuit to tolerate limited discrepancies as long as the signal crossing points remain in a reliable match detecting range of the comparator.

Although the present invention has been described in connection with a particular embodiment thereof it is to be understood that additional embodiments, modifications, and applications thereof which will be obvious to those skilled in the art are included within the spirit and scope of the invention.

I claim:
1. In combination
   a differential amplifier having complementary outputs subject to noninformational signal effects that cause those outputs to experience signal excursions with different direct current peak amplitudes for a predetermined common signal excursion direction, and means, responsive to peak excursions in said predetermined direction of said complementary outputs, for applying signals to an input of said amplifier to reduce the difference between those peak amplitudes.

2. The combination in accordance with claim 1 in which there are provided first and second differential input connections, a predetermined reference potential connection for said amplifier, first and second resistors of substantially the same resistance each connected between said reference potential connection and a different one of said input connections to provide common mode rejection of noise in the vicinity of said input connections.

3. The combination in accordance with claim 1 in which there are provided a plurality of power supply connections for said combination, and a plurality of voltage regulators, each coupled to supply voltage to a different one of said power supply connections.

4. The combination in accordance with claim 1 in which said applying means comprises first and second peak detectors, and means for coupling said peak detectors to apply said complementary outputs, respectively, to inverting and noninverting inputs of said differential amplifier for balancing said peak amplitudes.

5. The combination in accordance with claim 4 in which said coupling means comprises a further differential amplifier having a gain which is sufficient to actuate the first mentioned amplifier without overdriving it but also having a sufficiently high input impedance to have no substantial effect on the time constants of said peak detectors.

6. The combination in accordance with claim 4 in which said peak detectors each includes means for fixing the time constant thereof to a value greater than the period of the lowest expected information bit rate to be amplified in said differential amplifier.

7. The combination in accordance with claim 1 in which there are provided a comparator having differential input connections, and means for coupling said complementary outputs of said differential amplifier to said comparator differential inputs, respectively, to cause said comparator to produce a match indication in response to substantially simultaneous equality of said amplifier signal outputs during transitions between amplified information signal states.

8. the combination in accordance with claim 7 in which said comparator includes means for detecting said simultaneous equality over the range of input signal levels from said amplifier operating without automatic gain control.

9. The combination in accordance with claim 1 in which said applying means include means for coupling said peak excursion responsive signals to a low impedance circuit position in said amplifier to reduce amplifier sensitivity to circuit noise from said applying means.

10. The combination in accordance with claim 9 in which said amplifier includes at least an input differential amplification stage having a pair of transistors having base terminals thereof connected to receive signals to be amplified and having emitter terminals thereof connected through separate impedances to a common power supply connection for said transistors, and said coupling means includes means for connecting separate peak excursion signal information as to said complementary outputs to different ones of said emitter terminals.

11. In combination, a differential amplifier having complementary outputs which nominally exhibit substantially equal direct current peak amplitudes in a predetermined common direction in response to amplifier input binary signals of opposite binary signal states, respectively, but which amplifier is subject to noninformational signal effects that cause those outputs to experience signal excursions with different direct current peak amplitudes for said comon direction, said amplifier having at least an input differential amplification stage, and means, responsive to peak signal excursions in said predetermined direction of said complementary outputs, for separately coupling signals representing the peak amplitudes of said complementary outputs to different input connections, respectively, of said amplification stage to reduce the difference between those peak amplitudes.

* * * * *